(12) United States Patent
Min

(10) Patent No.: US 10,849,232 B2
(45) Date of Patent: Nov. 24, 2020

(54) PRINTED CIRCUIT BOARD

(71) Applicant: Samsung Electro-Mechanics Co., Ltd., Suwon-si (KR)

(72) Inventor: Byung-Seung Min, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/674,431

(22) Filed: Nov. 5, 2019

(65) Prior Publication Data

US 2020/0260587 A1 Aug. 13, 2020

(30) Foreign Application Priority Data

Feb. 11, 2019 (KR) .................. 10-2019-0015495

(51) Int. Cl.
*H05K 1/18* (2006.01)
*H01L 23/498* (2006.01)
*H05K 3/46* (2006.01)
*H05K 3/00* (2006.01)

(52) U.S. Cl.
CPC ....... *H05K 1/185* (2013.01); *H01L 23/49838* (2013.01); *H05K 3/0035* (2013.01); *H05K 3/4697* (2013.01)

(58) Field of Classification Search
CPC ........ H05K 1/182; H05K 1/183; H05K 1/185; H05K 1/184; H05K 3/4697
See application file for complete search history.

(56) References Cited

U.S. PATENT DOCUMENTS

| | | | | |
|---|---|---|---|---|
| 2006/0003495 | A1* | 1/2006 | Sunohara | H01L 24/82 438/124 |
| 2012/0181074 | A1* | 7/2012 | Ishihara | H05K 3/4691 174/261 |
| 2016/0021749 | A1* | 1/2016 | Bong | H05K 3/4697 174/260 |
| 2016/0198574 | A1* | 7/2016 | Lee | H05K 1/185 361/761 |
| 2017/0164468 | A1* | 6/2017 | Chang | H05K 3/4697 |
| 2019/0261513 | A1* | 8/2019 | Hizume | H05K 1/0271 |

FOREIGN PATENT DOCUMENTS

| | | |
|---|---|---|
| JP | 5655244 A | 1/2015 |
| KR | 10-2006-0048664 A | 5/2006 |
| KR | 10-1018281 A | 3/2011 |

* cited by examiner

*Primary Examiner* — Timothy J Thompson
*Assistant Examiner* — Amol H Patel
(74) *Attorney, Agent, or Firm* — NSIP Law

(57) ABSTRACT

A printed circuit board includes: a first insulating material; a metal layer disposed on a first surface of the first insulating material; a second insulating material disposed on the first surface of the first insulating material; a cavity penetrating through the second insulating material in an area of the second insulating material corresponding to the metal layer; and an insulating film disposed on a surface of the metal layer that is exposed by the cavity.

12 Claims, 5 Drawing Sheets

FIG. 1
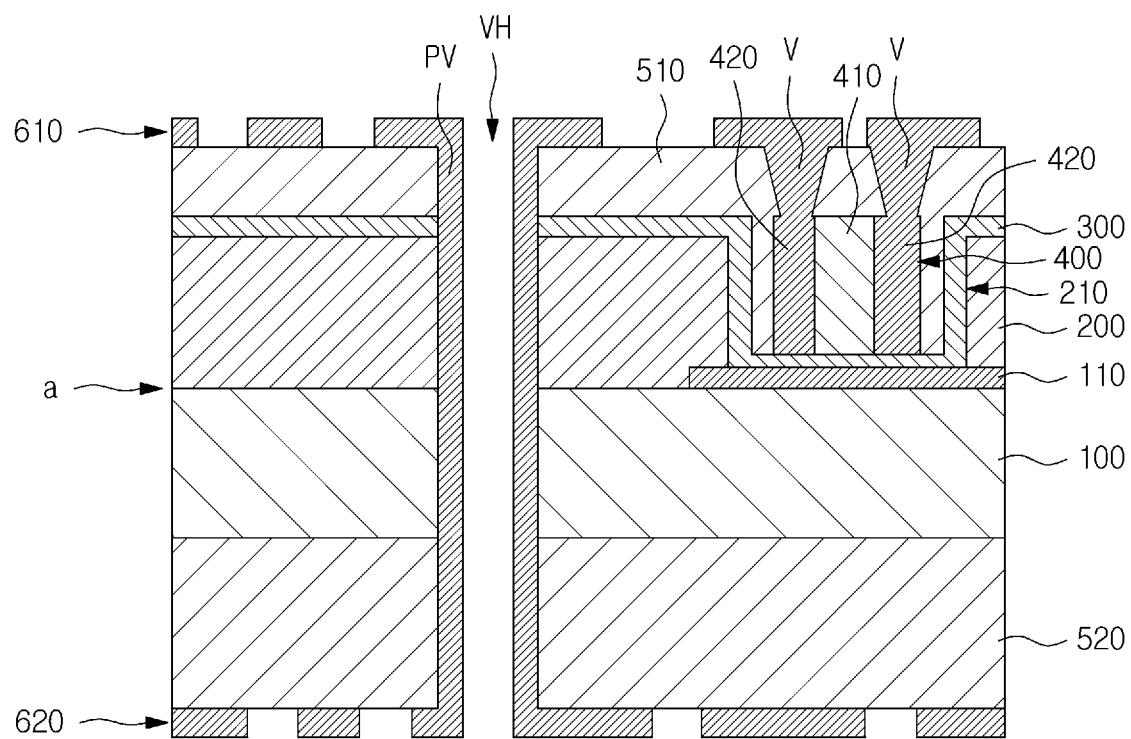
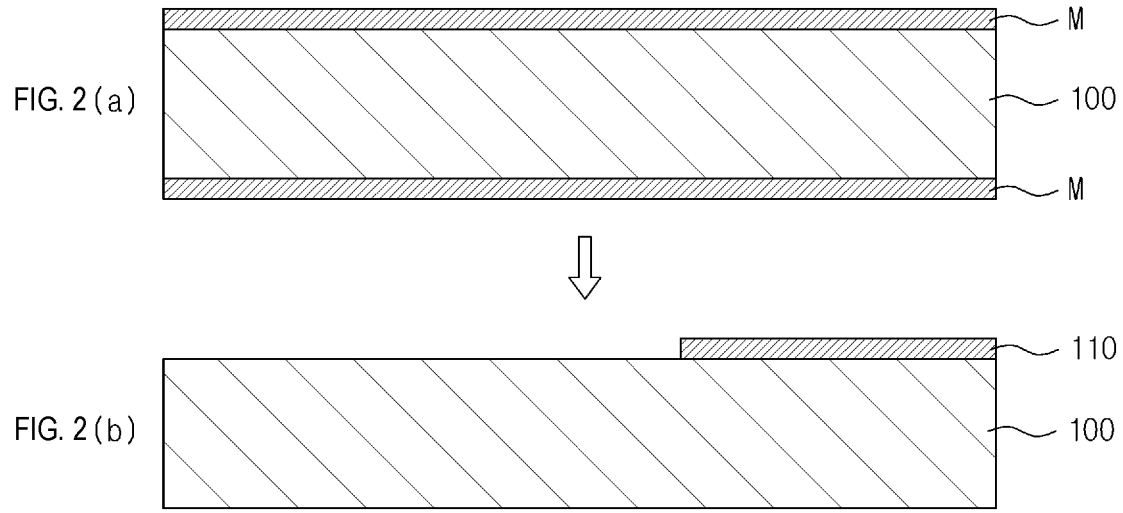

PRINTED CIRCUIT BOARD

CROSS-REFERENCE TO RELATED APPLICATION

This application claims the benefit under 35 USC 119(a) of Korean Patent Application No. 10-2019-0015495, filed on Feb. 11, 2019, entitled "PRINTED CIRCUIT BOARD", the entire disclosure of which is hereby incorporated by reference for all purposes.

BACKGROUND

1. Technical Field

The following description relates to a printed circuit board.

2. Description of the Background

In order to implement various functions, an electronic device is required to manage a greater amount of data. Accordingly, more numerous and various electronic components are required for the electronic device. The more electronic components that are included in the electronic device, the more passive elements are also required for the electronic components.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes: a first insulating material; a metal layer disposed on a first surface of the first insulating material; a second insulating material disposed on the first surface of the first insulating material; a cavity penetrating through the second insulating material in an area of the second insulating material corresponding to the metal layer; and an insulating film disposed on a surface of the metal layer that is exposed by the cavity.

The insulating film may be continuously formed from the surface of the metal layer that is exposed by the cavity to inner side surfaces of the cavity.

The insulating film may be continuously formed from the surface of the metal layer that is exposed by the cavity to a first surface of the second insulating material opposite the first surface of the first insulating material.

The insulating film may have a thickness smaller than a thickness of the second insulating material.

The printed circuit board may include an electronic element disposed on the insulating film in the cavity.

The electronic element may include external electrodes in contact with the insulating film.

The printed circuit board may include an insulating layer disposed on a first surface of the second insulating material opposite the first surface of the first insulating material.

The insulating layer may fill portions of the cavity in which the electronic element is not disposed.

The printed circuit board may include a via penetrating through the insulating layer and electrically connected to the electronic element.

The cavity may have a width equal to or less than a width of the metal layer.

The second insulating material may cover a side surface of the metal layer.

A circuit may not be formed on the first insulating material.

In another general aspect, a printed circuit board includes: a first insulating material; a second insulating material disposed on the first insulating material and comprising a cavity formed therein; a metal layer disposed at an interface between the first insulating material and the second insulating material; an insulating film disposed along inner surfaces of the cavity and a surface of the metal layer adjacent to the cavity; and an electronic element disposed at least partially in the cavity on the insulating layer.

Other features and aspects will be apparent from the following detailed description, the drawings, and the claims.

BRIEF DESCRIPTION OF THE DRAWINGS

FIG. 1 is a view illustrating a printed circuit board according to an example.

FIGS. 2(a), 2(b), 3, 4, 5, 6, and 7 are views illustrating a method of manufacturing a printed circuit board according to an example.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 3:
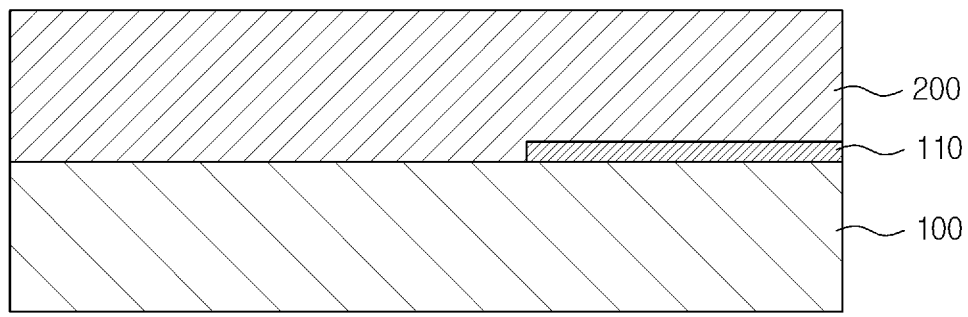

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 8:
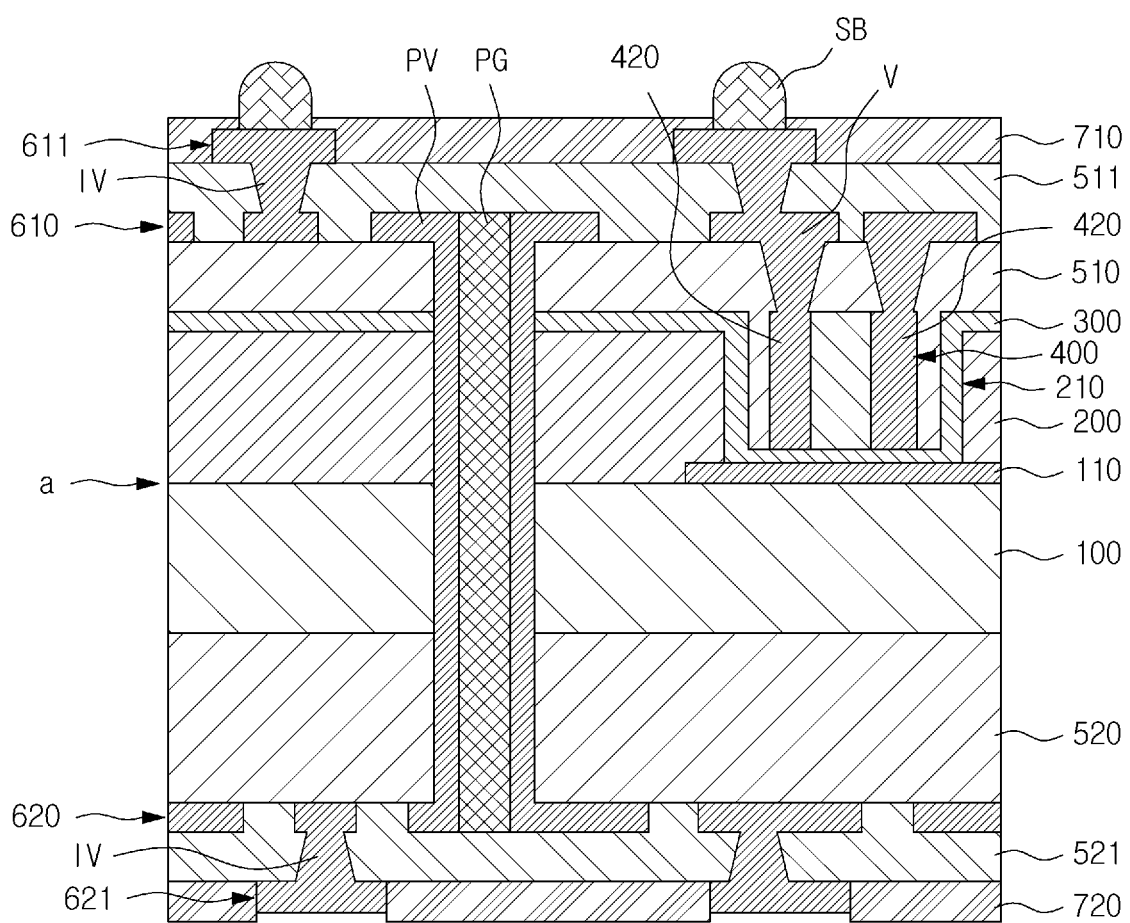
FIG. 8 is a view illustrating a printed circuit board according to an example.

FIGS. 1 and 8 are views illustrating a printed circuit board according to examples.

Referring to FIG. 1, the printed circuit board may include a first insulating material 100, a second insulating material 200, a cavity 210, and an insulating film 300.

The first insulating material 100 may be formed of a non-conductive material and have a plate-shaped structure. The first insulating material 100 may be formed of a material including a resin, and the resin included in the first insulating material 100 may be selected from a variety of thermosetting resins, thermoplastic resins, and the like. For example, the resin included in the first insulating material 100 may be selected from an epoxy resin, a polyimide (PI) resin, a bismaleimide-triazine (BT) resin, a liquid crystal polymer (LCP) or the like, but is not limited to these materials. A detailed material of the first insulating material 100 may be a prepreg (PPG) or an Ajinomoto build-up film (ABF).

The first insulating material 100 may include a fiber reinforcement or a filler. The fiber reinforcement may include a glass fiber, and the glass fiber may be at least one of a glass filament, a glass fiber, and a glass fabric which are classified depending on thickness. The prepreg may have a structure in which the epoxy resin is impregnated in the glass fiber. The filler may be an inorganic filler or an organic filler. The inorganic filler may include at least one selected from the group consisting of silica ($SiO_2$), alumina ($Al_2O_3$), silicon carbide (SiC), barium sulfate ($BaSO_4$), talc, clay, mica powder, aluminum hydroxide ($AlOH_3$), magnesium hydroxide ($Mg(OH)_2$), calcium carbonate ($CaCO_3$), magnesium carbonate ($MgCO_3$), magnesium oxide (MgO), boron nitride (BN), aluminum borate ($AlBO_3$), barium titanate ($BaTiO_3$), and calcium zirconate ($CaZrO_3$).

A metal layer 110 may be formed on the first insulating material 100. The metal layer 110 may include a metal such as copper (Cu) as a main component and function as a stopper in a process of forming a cavity 210, which is described below.

The metal layer 110 may have a smaller area than an entire upper surface of the first insulating material 100. The metal layer 110 may be in a shape of an island on the upper surface of the first insulating material 100.

The second insulating material 200 may be stacked on the first insulating material 100 and cover the metal layer 110. The second insulating material 200 may cover upper and side surfaces of the metal layer 110.

The second insulating material 200 may be formed of a material including a resin, and the resin forming the second insulating material 200 may be selected from a variety of thermosetting resins, thermoplastic resins, and the like. For example, the resin included in the second insulating material 200 may be selected from an epoxy resin, a polyimide (PI) resin, a bismaleimide-triazine (BT) resin, a liquid crystal polymer (LCP) or the like, but is not limited to these materials. A detailed material of the second insulating material 200 may be a prepreg (PPG) or an Ajinomoto build-up film (ABF).

The second insulating material 200 may include the above-described fiber reinforcement or the above-described filler. The second insulating material 200 may be formed of a material the same as or different from the first insulating material 100. The second insulating material 200 may have a thickness substantially the same as a thickness of the first insulating material 100.

The cavity 210 may be formed in the second insulating material 200. The cavity 210 may penetrate through the second insulating material 200 to be positioned on (above or adjacent to) the metal layer 110. An upper surface of the metal layer 110 may be exposed through a bottom surface of the cavity 210. The metal layer 110 may function as the stopper in a laser machining process of forming the cavity 210 so that the process of forming the cavity 210 may be stopped at the upper surface of the metal layer 110. The metal layer 110 may protect the first insulating material 100 from the laser machining process of forming the cavity 210.

The cavity 210 may have a width equal to or less than the metal layer 110. The cavity 210 may have a transverse cross-sectional area equal to or less than a width of the metal layer 110. Preferably, the cavity 210 may have a width and a transverse cross-sectional area equal to or less than that of the metal layer 110. Here, the width and the transverse cross-sectional area of the cavity 210 may refer to those of the bottom surface of the cavity 210. The width and the transverse cross-sectional area of the metal layer 110 may refer to those of the upper surface of the metal layer 110.

As illustrated in FIG. 1, only the metal layer 110 may be formed at an interface (a) between the first insulating material 100 and the second insulating material 200, and no circuit may be formed at the interface (a). Still, it is not excluded that a circuit may be formed at the interface between the first insulating material 100 and the second insulating material 200. When a circuit is formed at the interface between the first insulating material 100 and the second insulating material 200, the circuit may be spaced apart from the metal layer 110 to be electrically insulated from the metal layer 110 or the circuit may be connected to the metal layer 110, if necessary.

The insulating film 300 may be formed on the metal layer 110 positioned on the bottom surface of the cavity 210. The insulating film 300 may be formed on the metal layer 110 to insulate the metal layer 110 from a conductor that is mounted on the metal layer 110.

The insulating film 300 may be formed of a resin such as an epoxy resin, a polyimide resin or the like, but the material is not limited thereto.

The insulating film 300 may have a thickness smaller than the thickness of the first insulating material 100. The insulating film 300 may also have a thickness smaller than the thickness of the second insulating material 200.

The insulating film 300 may be formed by a method such as sputtering, chemical vapor deposition (CVD), spin coating or the like, and may have a uniform thickness.

The insulating film 300 may extend to inner side surfaces of the cavity 210 to cover entire inner side surfaces of the cavity 210. The insulating film 300 may be continuously formed from the bottom surface of the cavity 210 to the inner side surfaces of the cavity 210.

The insulating film 300 may be formed to further cover an upper surface of the second insulating material 200. That is, the insulating film 300 may be continuously formed from the bottom surface of the cavity 210 to the inner side surfaces of the cavity 210 and the upper surface of the second insulating material 200. The insulating film 300 may cover an entire upper surface of the second insulating material 200. The insulating film 300 may have a uniform thickness on all the above surfaces.

The printed circuit board may further include an electronic element 400.

The electronic element 400 may be inserted into the cavity 210 and brought in contact with the insulating film 300. The electronic element 400 may be one of various electronic elements such as an active element, a passive element or the like. At both ends of the electronic element 400, a pair of external electrodes 420 may be positioned and brought in contact with the insulating film 300. The external electrodes 420 may be conductive, but insulated from the metal layer 110 by the insulating film 300.

The electronic element 400 may be a passive element, and include a dielectric layer 410 including internal electrodes, and the external electrodes 420 may be formed on surfaces of the dielectric layer 410 and electrically connected to the internal electrodes. The pair of external electrodes 420 may be positioned at the both ends of the electronic element 400, respectively. The pair of external electrodes 420 may be spaced apart and electrically insulated from each other. If the insulating film 300 is not provided, the pair of external electrodes 420 of the electronic element 400 may be brought in contact with the metal layer 110, and then the pair of external electrodes 420 may be short-circuited from each other. However, in the example disclosed herein, the pair of external electrodes 420 may be insulated from each other by the insulating film 300.

As illustrated in FIG. 1, an upper surface of the electronic element 400 may be positioned on the same plane level as the upper surface of the second insulating material 200. Alternatively, the upper surface of the electronic element 400 may be positioned lower than the upper surface of the second insulating material 200 (see FIG. 6).

The printed circuit board may further include a first insulating layer 510 and a second insulating layer 520, build-up layers 511 and 521 (see FIG. 8), and solder resists 710 and 720 (see FIG. 8).

The first insulating layer 510 may be stacked on the upper surface of the second insulating material 200 and the second insulating layer 520 may be stacked on a lower surface of the first insulating material 100.

The first insulating layer 510 may fill the cavity 210. That is, the first insulating layer 510 may fill a space in the cavity 210 after the electronic element 400 is mounted in the cavity 210. Accordingly, the electronic element 400 may be fixed in the cavity 210.

The first insulating layer 510 may be formed of a material including a resin, and the resin included in the first insulating layer 510 may be selected from a variety of thermosetting resins, thermoplastic resins, and the like. For example, the resin included in the first insulating layer 510 may be selected from an epoxy resin, a polyimide (PI) resin, a bismaleimide-triazine (BT) resin, a liquid crystal polymer (LCP) or the like, but is not limited to these materials. A detailed material of the first insulating layer 510 may be a prepreg (PPG) or an Ajinomoto build-up film (ABF). The first insulating layer 510 may include the above-described fiber reinforcement or the above-described filler.

The first insulating layer 510 may be formed of the same material as the first insulating material 100 and/or the second insulating material 200.

A first circuit 610 may be formed on the first insulating layer 510. The first circuit 610 may be formed of at least one of copper (Cu), silver (Ag), palladium (Pd), aluminum (Al), nickel (Ni), titanium (Ti), gold (Au), and platinum (PT). The first circuit 610 may be formed of the same metal as a second circuit 620 and may be an inner-layer circuit.

A via (V) may be formed in the first insulating layer 510 to electrically connect the first circuit 610 and the electronic element 400 to each other. The via (V) may penetrate through the first insulating layer 510 and may be in contact with the external electrodes 420 of the electronic element 400.

The second insulating layer 520 may cover the lower surface of the first insulating material 100 and may be thicker than the first insulating layer 510. The second insulating layer 520 may be formed of the same material as the first insulating layer 510.

The second circuit 620 may be formed on a lower surface of the second insulating layer 520. The second circuit 620 may be formed of at least one of copper (Cu), silver (Ag), palladium (Pd), aluminum (Al), nickel (Ni), titanium (Ti), gold (Au) and platinum (Pt). The second circuit 620 may be formed of the same metal as the first circuit 610. The first circuit 610 and the second circuit 620 may be inner-layer circuits.

The first insulating material 100, the second insulating material 200, the insulating film 300, the first insulating layer 510 and the second insulating layer 520 may form a core layer together. In this case, the electronic element 400 may be embedded in the core layer to be deviated upwardly or downwardly from a center of the core layer. In addition, only the metal layer 110 may be formed at the interface (a) between the first insulating material 100 and the second insulating material 200, and no circuit may be formed at the interface (a). The core layer may have a thickness of 0.4 mm or more.

The core layer may include a penetrating via (PV) collectively penetrating through the first insulating material 100, the second insulating material 200, the insulating film 300, the first insulating layer 510 and the second insulating layer 520. As illustrated in FIG. 1, the penetrating via (PV) may include a plating layer formed on the inner surface of a via hole (VH). Alternatively, the penetrating via (PV) may be a fill-plated via hole (VH). Alternatively, as illustrated in FIG. 8, the plating layer may be formed on the inner surface of the via hole (VH), and then an inner portion of the via hole (VH) may be filled with an insulating material or a conductive plugging (PG) material. The plugging material may include ink, solder resist and the like.

Build-up layers may be stacked on the first insulating layer 510 and the second insulating layer 520, respectively. The build-up layer may be formed of the same material as the first insulating layer 510 and/or the second insulating layer 520.

A first build-up layer 511 may be stacked on an upper surface of the first insulating layer 510. A third circuit 611 may be formed on the first build-up layer 511. The first circuit 610 and the third circuit 611 may be electrically connected to each other through an inner via (IV).

A second build-up layer 521 may be stacked on the lower surface of the second insulating layer 520. A fourth circuit 621 may be formed on a lower surface of the second build-up layer 521. The second circuit 620 and the fourth circuit 621 may be electrically connected to each other through the inner via (IV). The third circuit 611 and the fourth circuit 621 may be outer-layer circuits.

Solder resists 710 and 720 may be stacked on outer surfaces of the first build-up layer 511 and the second build-up layer 521, respectively. The solder resists 710 and 720 may partially expose the outer-layer circuits 611 and 621, respectively. In particular, in a state in which the electronic element 400 is positioned to be deviated from the center of the core layer, the solder resist 710 may expose the outer-layer circuit 611, and a bonding member such as a solder ball (SB) may be formed on the exposed outer-layer circuit 611. This bonding member SB may be mounted with an electronic component such as a chip (an integrated chip (IC), a central processing unit (CPU), a graphic processing unit (GPU), an application processor (AP), etc.). Alternatively, the bonding member SB may be bonded to an external board. Another bonding member may also be formed on the outer-layer circuit 621 exposed through the opposite solder resist 720, and the outer-layer circuit 621 may be connected to a main board by this bonding member.

FIGS. 2(a), 2(b), 3, 4, 5, 6, and 7 are views illustrating a method of manufacturing the printed circuit board according to an example.

Referring to FIG. 2(a), a first insulating material 100 may be prepared and a metal foils (M) is stacked on upper and lower surfaces of the first insulating material 100. The metal foil (M) may be a copper foil.

Referring to FIG. 2(b), a metal layer 110 may be formed by completely removing the metal foil (M) on the lower surface and patterning the metal foil (M) on the upper surface. The metal foil (M) may be removed and patterned by etching.

Referring to FIG. 3, a second insulating material 200 may be stacked on the first insulating material 100 on which the metal layer 110 is formed. The second insulating material 200 may cover both the upper and side surfaces of the metal layer 110.

Figure 4:
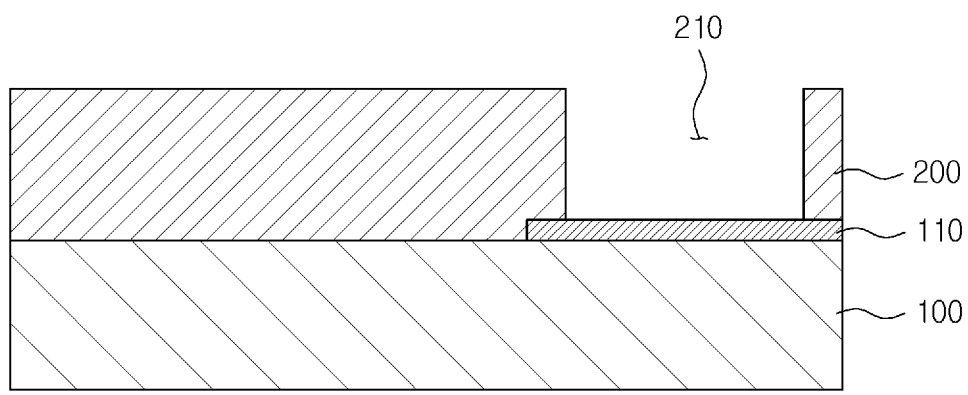

Referring to FIG. 4, a cavity 210 may be formed in the second insulating material 200.

The cavity 210 may be formed by performing a laser machining, and the metal layer 110 may serve as a stopper. In this case, the second insulating material 200 may be partially removed by performing the laser machining, but the first insulating material 100 may be protected from the laser machining by the metal layer 110.

Figure 5:
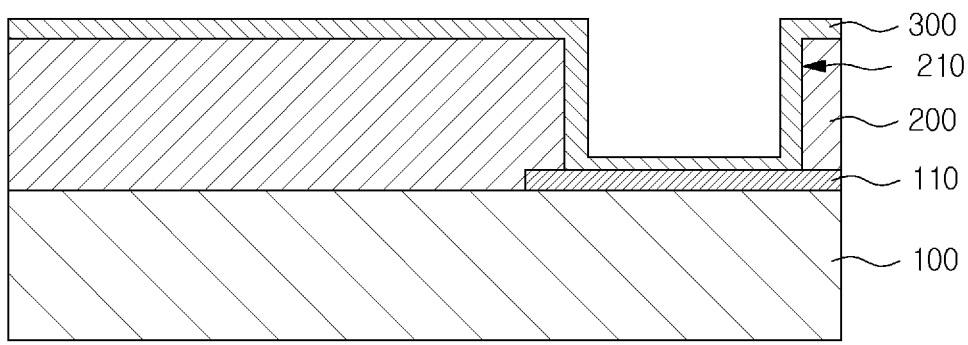

Referring to FIG. 5, an insulating film 300 may be continuously formed from a bottom surface of the cavity 210 to inner side surfaces of the cavity 210 and an upper surface of the second insulating material 200. The insulating film 300 may be formed by a method such as sputtering, chemical vapor deposition (CVD), spin coating or the like, and may have a uniform thickness.

Figure 6:
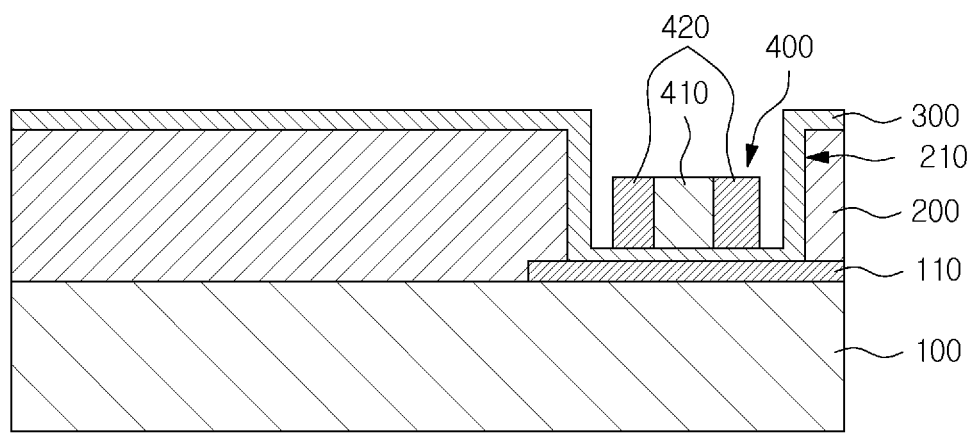

Referring to FIG. 6, an electronic element 400 may be inserted into the cavity 210 and contact the insulating film 300. The electronic element 400 may include a dielectric layer 410 and external electrodes 420.

Figure 7:
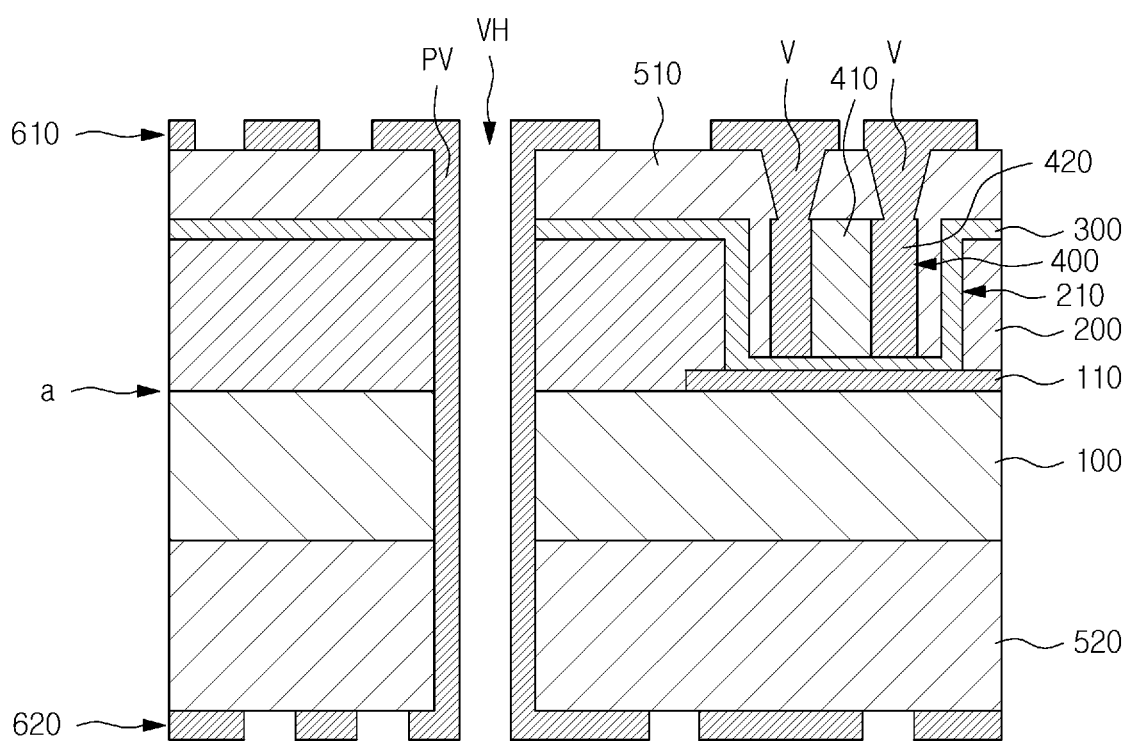

Referring to FIG. 7, a first insulating layer 510 and a second insulating layer 520 may be stacked on the upper surface of the second insulating material 200 and a lower surface of the first insulating material 100, respectively, and inner-layer circuits may be formed on the first and second insulating layers 510 and 520. A penetrating via (PV) may be formed to penetrate through the first insulating material 100, the second insulating material 200, the insulating film 300, the first insulating layer 510, and the second insulating layer 520. The penetrating via (PV) may be formed by forming a via hole (VH) and then forming a plating layer on an inner surface of the via hole (VH) or plugging after forming the plating layer.

Referring to FIG. 8, a first build-up layer 511 and a second build-up layer 521 may be stacked on an upper surface of the first insulating layer 510 and a lower surface of the second insulating layer 520, respectively, and outer-layer circuits may be formed on lower surfaces of the first build-up layer 511 and the second build-up layer 521. Solder resists 710 and 720 may be stacked on outer surfaces of the first build-up layer 511 and the second build-up layer 521, respectively, and the solder resists 710 and 720 may be partially opened. A bonding member such as a solder ball (SB) may be formed on each of the outer-layer circuits exposed through the partially opened solder resists 710 and 720.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
   a first insulating material;
   a metal layer disposed on a first surface of the first insulating material;
   a second insulating material disposed on the first surface of the first insulating material;
   a cavity penetrating through the second insulating material in an area of the second insulating material corresponding to the metal layer; and
   an insulating film disposed on an entirety of a surface of the metal layer that is exposed by the cavity, wherein the insulating film is continuously formed from the surface of the metal layer that is exposed by the cavity to a first surface of the second insulating material opposite the first surface of the first insulating material.

2. The printed circuit board of claim 1, wherein the insulating film is continuously formed from the surface of the metal layer that is exposed by the cavity to inner side surfaces of the cavity.

3. The printed circuit board of claim 1, wherein the insulating film has a thickness smaller than a thickness of the second insulating material.

4. The printed circuit board of claim 1, further comprising an electronic element disposed on the insulating film in the cavity.

5. The printed circuit board of claim 4, wherein the electronic element comprises external electrodes in contact with the insulating film.

6. The printed circuit board of claim 4, further comprising an insulating layer disposed on a first surface of the second insulating material opposite the first surface of the first insulating material.

7. The printed circuit board of claim 6, wherein the insulating layer fills portions of the cavity in which the electronic element is not disposed.

8. The printed circuit board of claim 6, further comprising a via penetrating through the insulating layer and electrically connected to the electronic element.

9. The printed circuit board of claim 1, wherein the cavity has a width equal to or less than a width of the metal layer.

10. The printed circuit board of claim 1, wherein the second insulating material covers a side surface of the metal layer.

11. The printed circuit board of claim 1, wherein a circuit is not formed on the first insulating material.

12. A printed circuit board comprising:
    a first insulating material;
    a second insulating material disposed on the first insulating material and comprising a cavity formed therein;
    a metal layer disposed at an interface between the first insulating material and the second insulating material;
    an insulating film disposed along inner surfaces of the cavity and an entirety of a surface of the metal layer adjacent to the cavity; and
    an electronic element disposed at least partially in the cavity on the insulating film, the electronic element comprising external electrodes in contact with the insulating film.

* * * * *